United States Patent
Choke et al.

(10) Patent No.: US 8,933,733 B2
(45) Date of Patent: Jan. 13, 2015

(54) METHOD AND SYSTEM FOR FAST SYNCHRONIZED DYNAMIC SWITCHING OF A RECONFIGURABLE PHASE LOCKED LOOP (PLL) FOR NEAR FIELD COMMUNICATIONS (NFC) PEER TO PEER (P2P) ACTIVE COMMUNICATIONS

(71) Applicant: MediaTek Singapore Pte. Ltd., Singapore (SG)

(72) Inventors: Tieng Ying Choke, Singapore (SG); Yuan Sun, Singapore (SG); Huajiang Zhang, Singapore (SG); Osama K A Shana'a, Singapore (SG)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/072,719

(22) Filed: Nov. 5, 2013

(65) Prior Publication Data

US 2014/0218080 A1 Aug. 7, 2014

Related U.S. Application Data

(60) Provisional application No. 61/749,452, filed on Jan. 7, 2013.

(51) Int. Cl.
*H03L 7/06* (2006.01)
*H03L 7/083* (2006.01)
*H04B 5/00* (2006.01)

(52) U.S. Cl.
CPC .............. *H03L 7/083* (2013.01); *H04B 5/0056* (2013.01)
USPC .......................................... 327/148; 327/157

(58) Field of Classification Search
USPC .................................................. 327/148, 157
See application file for complete search history.

(56) References Cited

U.S. PATENT DOCUMENTS

| 5,251,261 | A | * | 10/1993 | Meyer et al. | 704/211 |
|---|---|---|---|---|---|
| 5,371,741 | A | * | 12/1994 | Entani | 370/537 |
| 5,933,058 | A | * | 8/1999 | Pinto et al. | 331/17 |
| 6,701,445 | B1 | * | 3/2004 | Majos | 713/500 |
| 6,904,110 | B2 | * | 6/2005 | Trans et al. | 375/350 |
| 7,583,774 | B2 | * | 9/2009 | Lesso | 375/377 |
| 8,442,178 | B2 | * | 5/2013 | Kim et al. | 375/375 |
| 8,731,007 | B2 | * | 5/2014 | Bar-Sade et al. | 370/538 |
| 2001/0018751 | A1 | * | 8/2001 | Gresham | 713/401 |
| 2011/0081872 | A1 | * | 4/2011 | Bar-Sade et al. | 455/77 |
| 2011/0221487 | A1 | * | 9/2011 | Lesso | 327/147 |
| 2013/0342251 | A1 | * | 12/2013 | Patel et al. | 327/158 |

OTHER PUBLICATIONS

"PN544 Near field communication (NFC) controller", Rev. 1.3—Dec. 10, 2008, Objective short data sheet, NXP Semiconductors.

* cited by examiner

*Primary Examiner* — Adam Houston
(74) *Attorney, Agent, or Firm* — Sawyer Law Group, P.C.

(57) ABSTRACT

A reconfigurable circuit is disclosed. The reconfigurable circuit comprises a pause detector mechanism, a clock extractor, and a multiplexer. The multiplexer is configured to receive a reference clock and is coupled to the clock extractor to receive a clock extracted from a carrier of a near field communication (NFC) field. The reconfigurable circuit also comprises a phase locked loop (PLL) coupled to the pause detector mechanism and the multiplexer, and the PLL can be configured in a first mode to be locked to the reference clock, in a second mode to be locked to the extracted clock, and in a third mode wherein the PLL can switch between being locked to the reference clock and being locked to the extracted clock.

17 Claims, 17 Drawing Sheets

US 8,933,733 B2

METHOD AND SYSTEM FOR FAST SYNCHRONIZED DYNAMIC SWITCHING OF A RECONFIGURABLE PHASE LOCKED LOOP (PLL) FOR NEAR FIELD COMMUNICATIONS (NFC) PEER TO PEER (P2P) ACTIVE COMMUNICATIONS

CROSS-REFERENCE TO RELATED APPLICATION

This application claims benefit under 35 USC 119(e) of U.S. Provisional Patent Application No. 61/749,452, filed on Jan. 7, 2013, which is incorporated herein by reference in its entirety.

FIELD OF THE INVENTION

The present invention relates generally to Near Field Communication (NFC), and more particularly to transmitter (TX) and receiver (RX) synchronous switching during NFC active peer-to-peer P2P communications modes.

BACKGROUND

In a conventional near field communication (NFC) clock generation methodology or system, two separate clock generation schemes are required for the NFC reader and the NFC card respectively. In addition, an active Peer to Peer (P2P) NFC implementation requires a short frame delay time of ~188 us. In such a system, an active target/initiator needs to respond to an initiator/target within 57-188 us. In active P2P Mode, both a reader clock which is synchronous to a reference clock and a card clock which is synchronous to NFC H-field need to be made available concurrently due to a stringent TX and RX Frame Delay Timing (FDT). Moreover, as both clocks are asynchronous, digital synchronization during P2P transmitter and receiver modes is required.

A digital baseband circuit performs synchronized clock switching/swapping to ensure continuous clocks to the digital circuit during P2P active mode. Such an approach will inevitably consume higher current and require large silicon area to implement.

The following are the drawbacks of a conventional NFC system:
1. Requires large silicon area.
2. Requires large current consumption when both clock generations need to be turned on in P2P Active mode.
3. Requires complex clock swapping/synchronization to digital base-band when both clock generation need to be enabled in P2P Active mode since both clocks are not synchronized.

Accordingly, what is desired is a system and method that addresses the above-identified issues. The system and method should be cost effective, easily implemented and adaptable to existing systems. The present invention addresses such a need.

SUMMARY

A reconfigurable circuit is disclosed. The reconfigurable circuit comprises a pause detector mechanism, a clock extractor, a multiplexer and a phase locked loop (PLL). The multiplexer is configured to receive either a reference clock from crystal oscillator or NFC H-Field Extracted Clock from the clock extractor and is coupled to the phase frequency detector (PFD) of the PLL. The PLL can be configured in a first mode to be locked to the reference clock, in a second mode to be locked to the extracted clock, and in a third mode wherein the PLL can dynamically be switched between being locked to the reference clock and being locked to the extracted clock.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A reconfigurable PLL in accordance with an embodiment can be configured for:
1. Reader (PCD) mode (Fractional-N PLL locked to reference/crystal oscillator (XO) clock)
2. Card (PICC) mode (Integer-N PLL locked to RF field)
3. P2P Passive Mode (Remained as PCD if act as Initiator or PICC if act as Target)
4. P2P Active Mode (Fast dynamic Synchronized Switching between PCD and PICC using single PLL)

Figure 1:
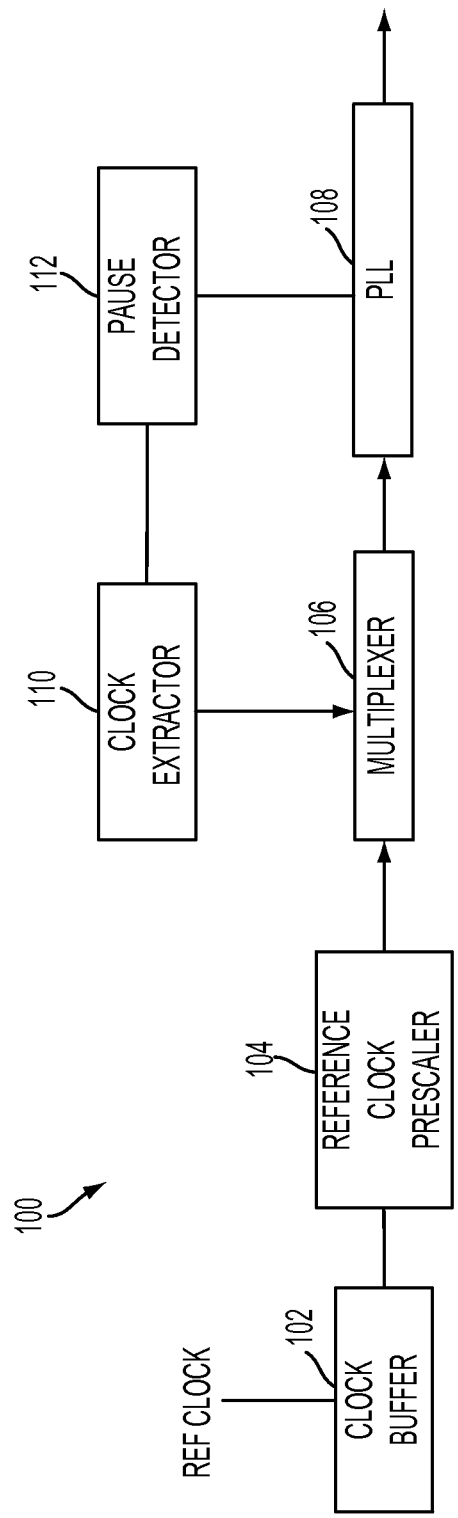
FIG. 1 is a simple block diagram of a reconfigurable Phase Locked Loop (PLL) in accordance with the present invention.

To describe these features in more detail refer now to following discussion in conjunction with the accompanying figures. FIG. 1 is a simple block diagram of a reconfigurable phase locked loop (PLL) 100 in accordance with one embodiment of the present invention. In the reconfigurable PLL 100, a reference clock (e.g., REF CLOCK) is provided from a clock buffer 102 (with a reference clock prescaler 104) to a PLL 108 via a multiplexer 106. NFC H-Field clock extracted by a clock extractor 110 (with a pause detector 112) is also coupled to the PLL 108 via the multiplexer 106. The output of the multiplexer 106 is provided to the PLL 108. Thereafter, the PLL 108 provides an output clock signal. The reconfigurable PLL 100 can be configured as the fractional-N PLL (locked to reference/XO clock) in reader mode and an Integer-N PLL (locked to a clock extracted from the NFC H-Field field, e.g., from a carrier of the RX field) in a card mode. The reconfigurability of the PLL 100 allows the use of the same circuitry in different modes which reduces the overall size and cost of the circuit.

To describe with particularity the operation of the reconfigurable PLL 100 in the different modes refer now to the following description and the accompanying Figures.

Figure 2A:
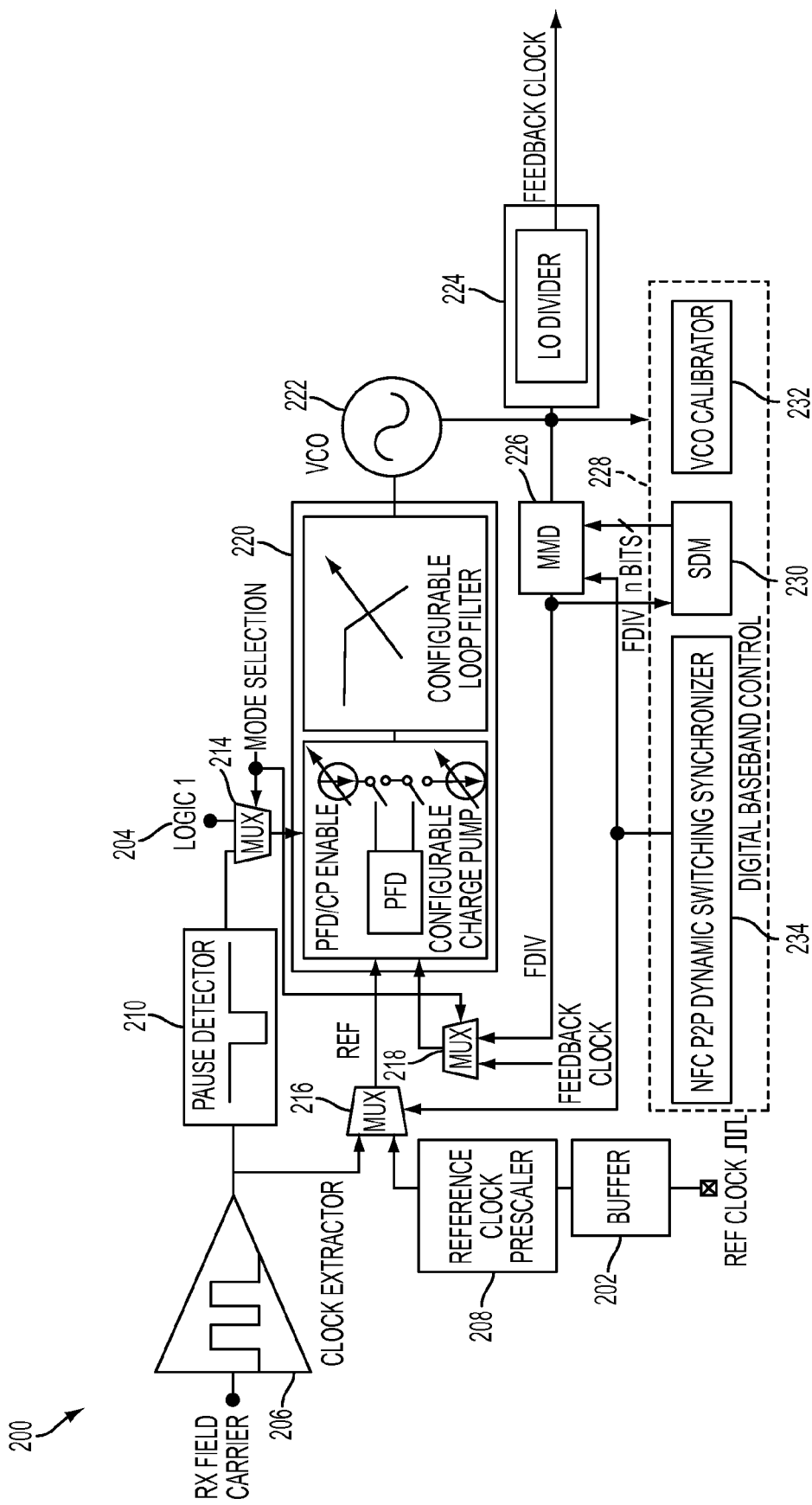
FIGS. 2A-2G illustrate a detailed embodiment of a reconfigurable PLL in accordance with the present invention.

FIGS. 2A-2G illustrate a detailed embodiment of a reconfigurable PLL 200 in accordance with embodiments of the present invention. Referring to FIG. 2A, the reconfigurable PLL 200 includes a buffer 202 that receives a reference clock signal (e.g., REF Clock) and provides the reference clock to a reference clock prescaler 208. The outputs of the reference clock prescaler 208 and a clock extractor 206 are both provided to a multiplexer 216. The output (e.g., REF) of the multiplexer 216 is provided to a circuit 220 that includes a phase frequency detector (PFD), charge pump (CP), and configurable loop filter (LF). The clock extractor 206 provides its output to a pause detector 210. The pause detector 210 in turn is coupled to one of the inputs of a multiplexer 214. The other input of the multiplexer 214 is "logic 1" when selected during PCD (reader) mode and P2P active (Initiator/target) mode where NFC Field transmission is required.

The circuit 220 provides an output to a controlled oscillator, for example a voltage controlled oscillator (VCO) 222. The VCO 222 provides a signal to a programmable local oscillator (LO) divider 224. The LO divider 224 provides output signal (e.g., the Feedback Clock) that is provided one input of a multiplexer 218.

The VCO 222 provides a signal to a multi-modulus divide (MMD) 226 and the digital baseband control 228. The digital baseband control 228 comprises a sigma delta modulator (SDM) 230, a VCO calibrator 232 and A NFC P2P dynamic switching synchronizer 234. The MMD 226 provides a second input (e.g., the FDIV) to the multiplexer 218. The output of the multiplexer 218 is provided to the circuit 220.

The reconfigurable PLL 200 can be configured to operate in:
1. Reader (PCD) mode (fractional-N PLL locked to reference clock/XO clock)
2. Card (PICC) mode (Integer-N PLL locked to RF field)
3. P2P Passive Mode (PCD if acting as an initiator or PICC if acting as a Target)
4. P2P Active Mode (Fast dynamic Synchronized Switching between PCD and PICC using single PLL)

Each of these modes of operation will be described in more detail herein below, in which the bolded lines illustrated in each FIGS. 2B-2G show the enabled signal connections in the corresponding mode.

1. PCD/Reader Mode (Fast Dynamic Synchronized Switching not Required)

Figure 2B:
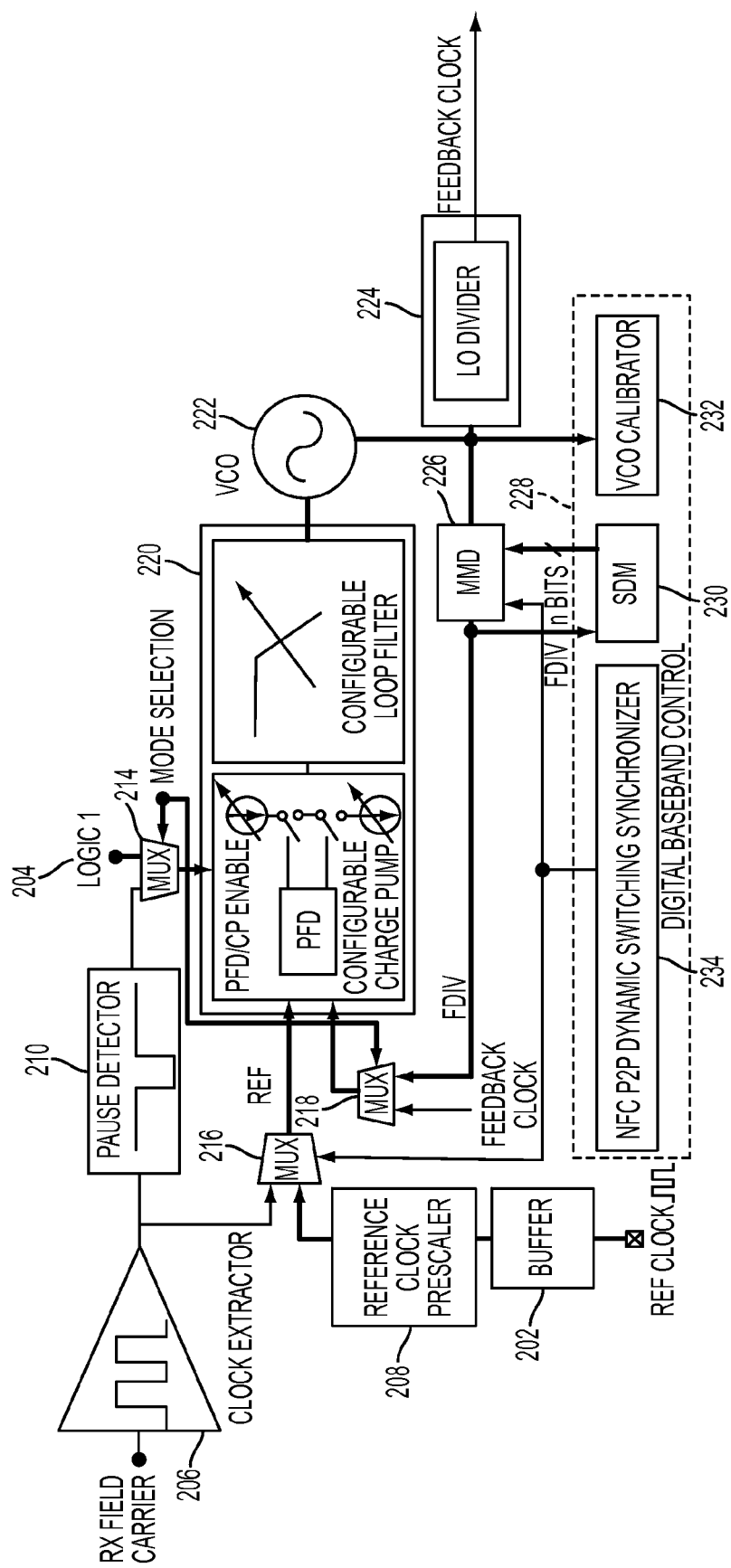

FIG. 2B illustrates the reconfigurable PLL 200 operating in NFC PCD (reader) mode, in which the bolded lines show the enabled signal connections in this mode. The reconfigurable PLL 200 is configured as a fractional-N PLL which is locked to the available reference clock for example, for 13.56 MHz clock synthesis. It will remain in fractional-N PLL mode until a near field communication (NFC) reader (PCD) transaction is completed.

2. PICC/Card Mode (Fast Dynamic Synchronized Switching not Required)

Figure 2C:
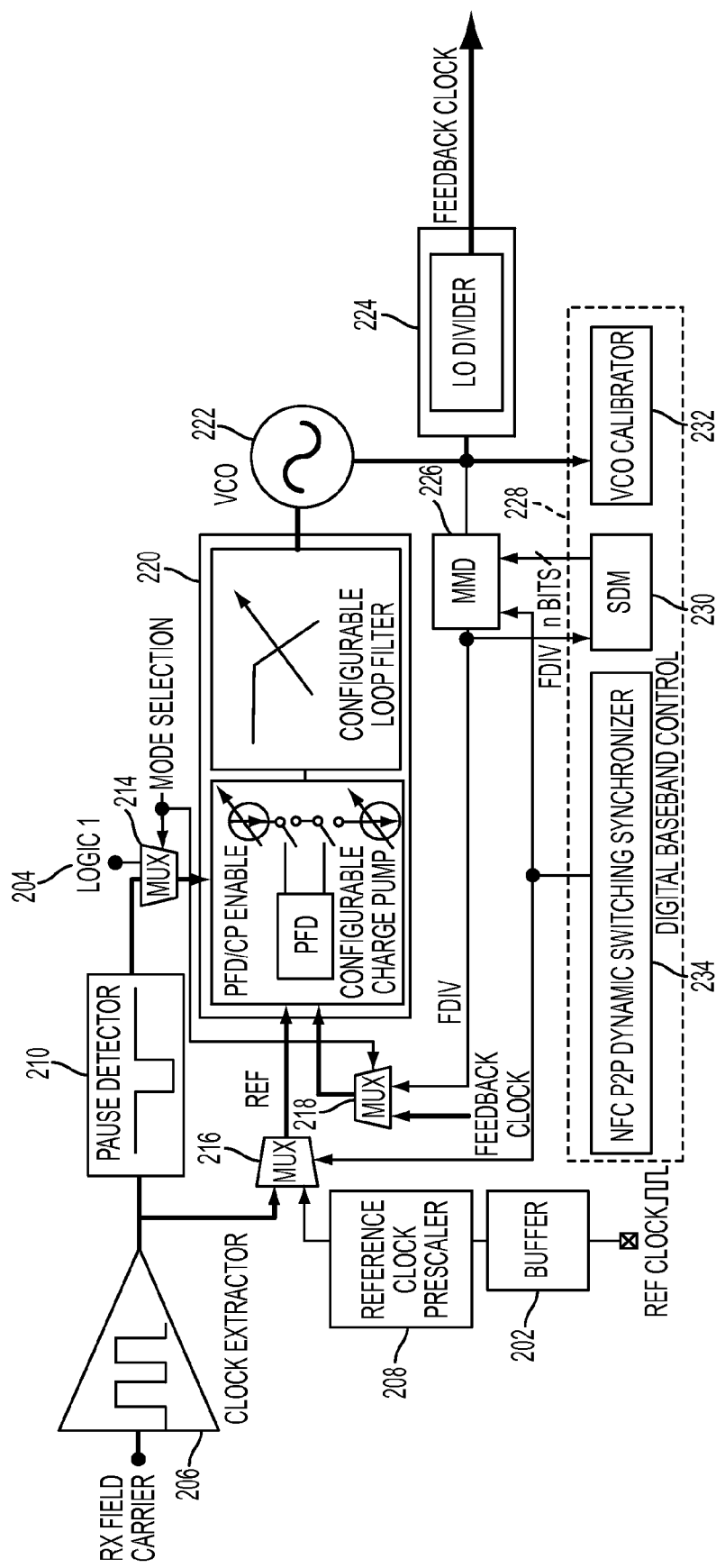

FIG. 2C illustrates the reconfigurable PLL 200 operating in NFC PICC (card) mode, in which the bolded lines show the enabled signal connections in this mode. The reconfigurable PLL 200 will be configured as a carrier recovery PLL which is locked to a clock extracted from the carrier of NFC H-Field (e.g., the RX field carrier). It will remain in carrier recovery PLL until the NFC Card (PICC) transaction is completed.

P2P Active Target Mode with Fast Dynamic Synchronized Switching

Figure 2D:
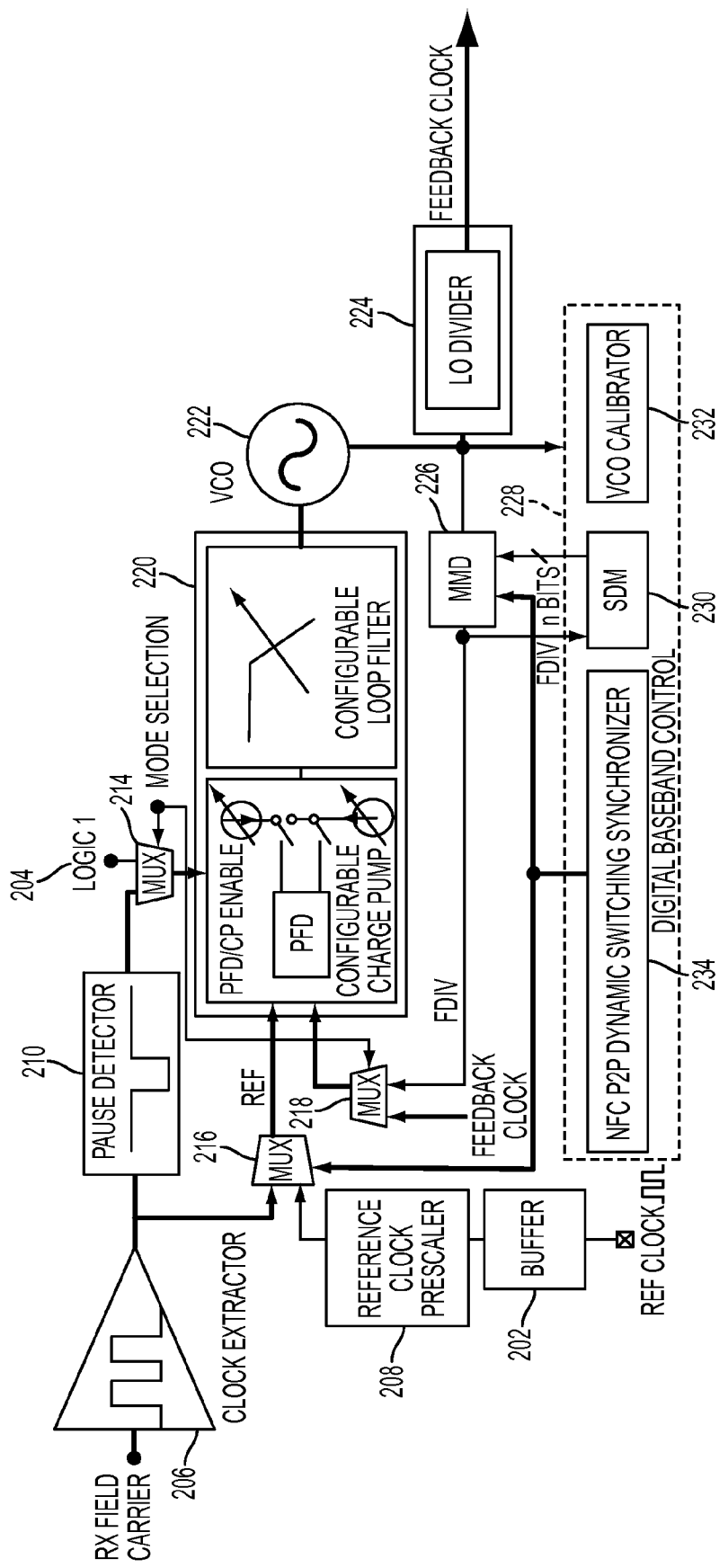
Figure 2E:
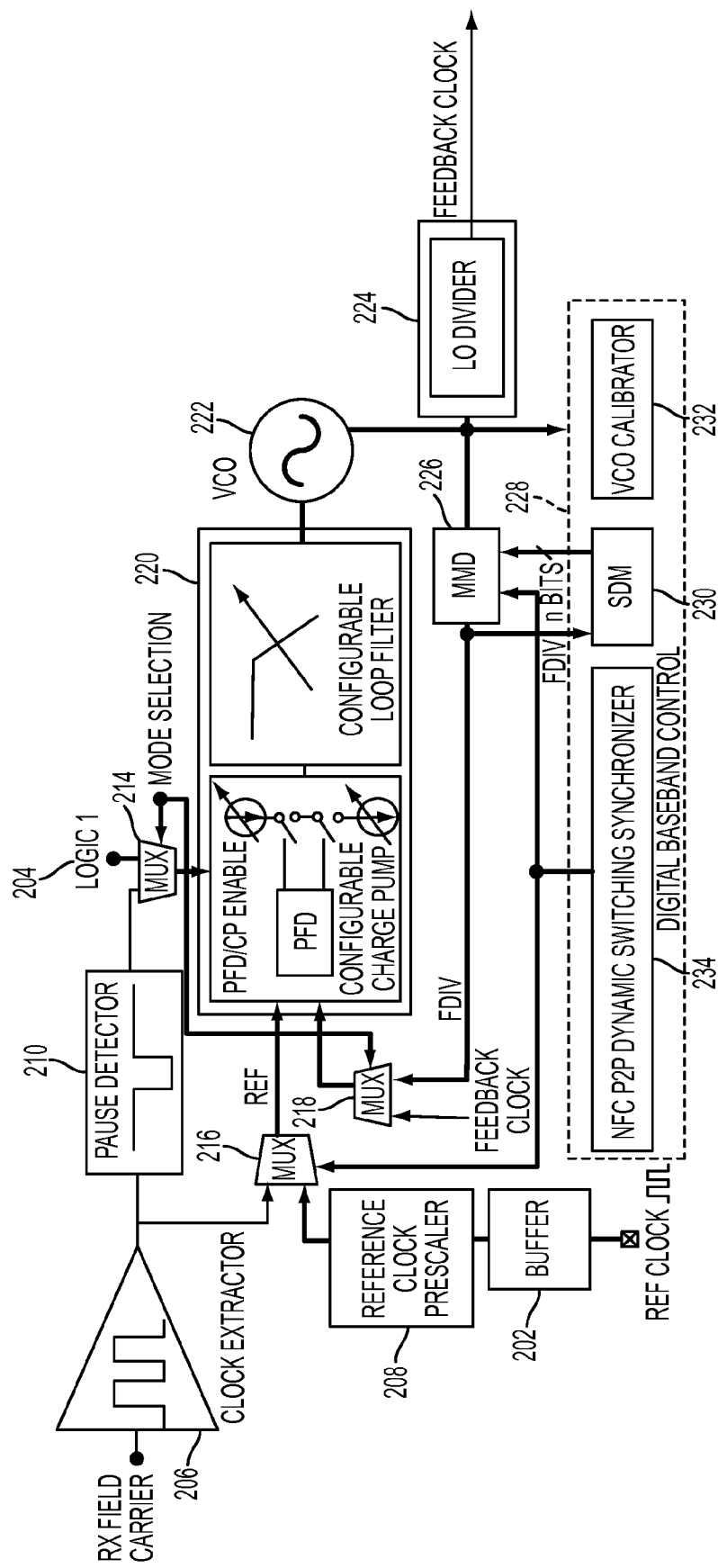

FIGS. 2D and 2E illustrate the reconfigurable PLL 200 operating in NFC P2P active target reception/transmission modes, respectively, in which the bolded lines show the enabled signal connections in the corresponding mode. The reconfigurable PLL 200 will be configured to a carrier recovery PLL which is locked to the extracted clock of the carrier in NFC field during data reception. Once data has been demodulated and active P2P mode is requested and the Initiator field is turn off, the reconfigurable PLL 200 of the P2P active target will be configured to fractional-N PLL to generate the TX NFC field from the reference/XO clock (e.g., Ref Clock). Since VCO sub-band and LO dividers remain unchanged throughout the PLL dynamic synchronized switching reconfiguration, the same clock to baseband path remains continuous throughout the P2P active target communications.

Figure 3:
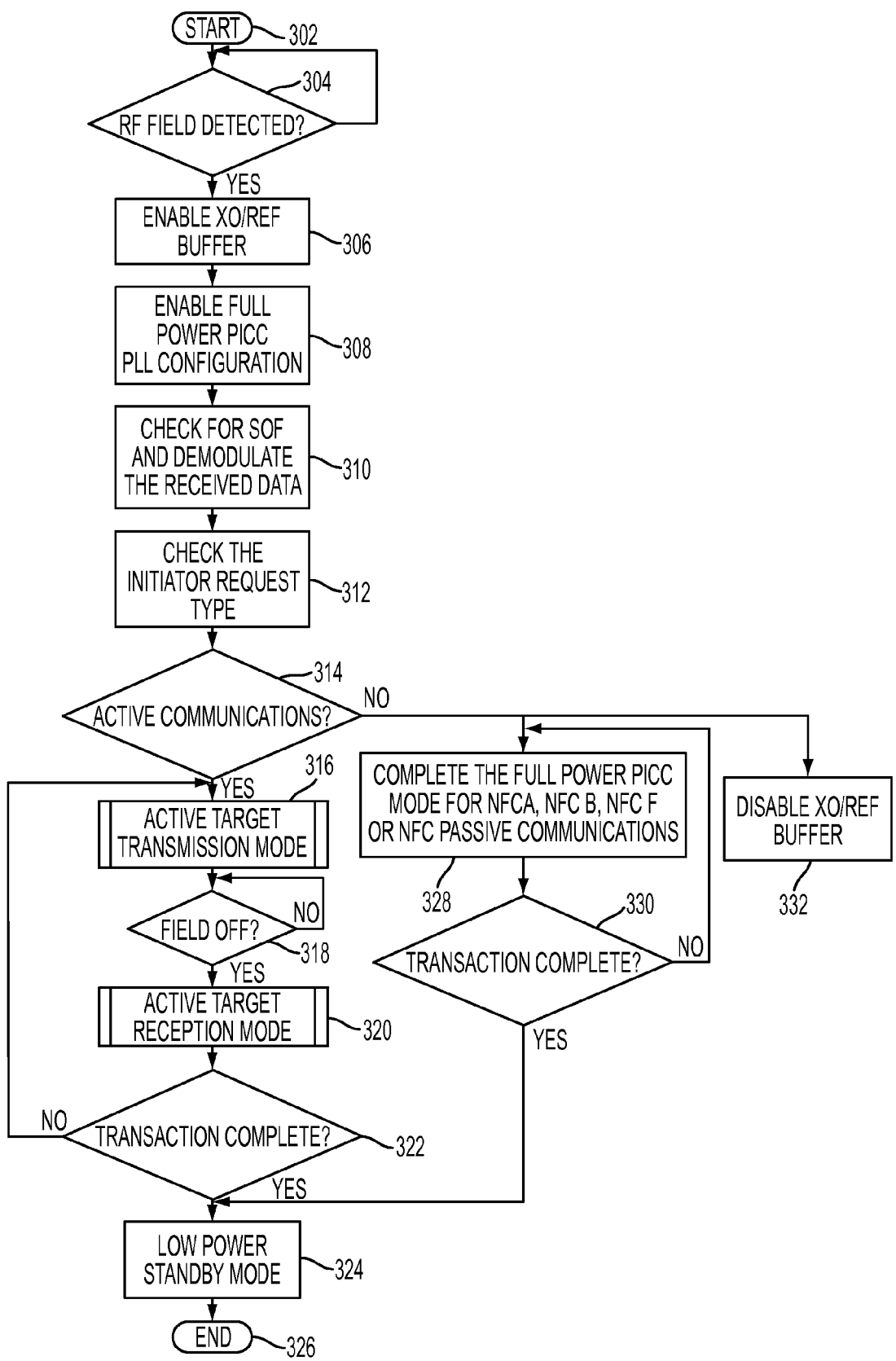
FIG. 3 is a flow chart of an active target during P2P communication.

FIG. 3 is a flow chart of an active target during P2P communication. Referring to FIGS. 2A and 3 together, an active target starts a P2P communication process, via step 302. Next, a determination is made on whether a RF field is detected, via step 304. If a RF field is detected, the buffer 202 is enabled, via step 306. Then, a full power PICC PLL configuration is enabled, via step 308. The start of frame (SOF) is then checked and the received data is demodulated, via step 310. Next the initiator request type is checked, via step 312. A determination is then made on whether active communications exist, via step 314. If active communications is detected, then the active target transmission mode is selected, via step 316. A determination is then made on whether the field is off, via step 318. If the field is on the same determination is repeated, via step 318. If the field is off then the active target reception mode is selected, via step 320.

Next, it is determined whether the transaction is completed, via step 322. If transaction is not completed steps 316 through 322 are repeated. If the transaction is completed a low power standby mode is selected, via step 324. Thereafter, the P2P communication process ends, via step 326.

If active communication is not detected, via step 314, then a full power PICC mode for NFC-B, NFC-F or NFC passive communications is activated, via step 328, and the buffer 202 is disabled, via step 332. If the full power PICC mode for NFC-B, NFC-F or NFC passive communications is not completed, step 328 will be repeated until the transaction is completed. Once the transaction is completed, via step 328, low power standby mode is selected, via step 324.

Figure 4:
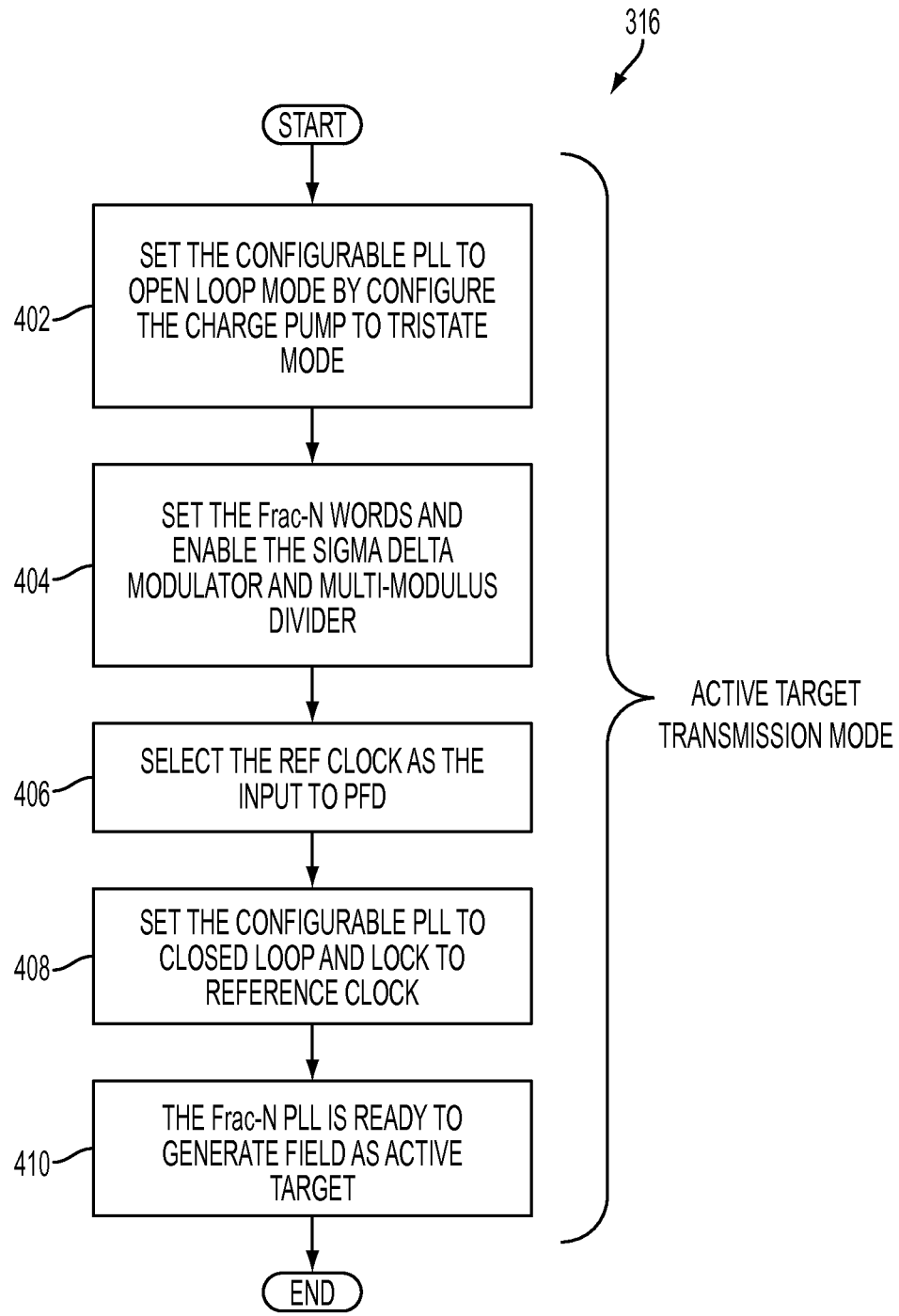
FIG. 4 is a flow chart of an active target transmission.

FIG. 4 is a flow chart of an active target transmission. Referring to FIGS. 2A and 4 together, the reconfigurable PLL 200 is set to open loop mode by configuring the charge pump to a tristate mode, via step 402. Next, the fractional-N words are set and the sigma delta modulator (SDM) 230 and multi-modulus divider (MMD) 226 are enabled, via step 404. The reference clock is then selected as the input to PFD of circuit 220, via step 406. The reconfigurable PLL 200 is set to closed loop mode and a lock to a reference clock is set, via step 408. Finally, the fractional-N PLL is ready to generate field as active target, via step 410.

Figure 5:
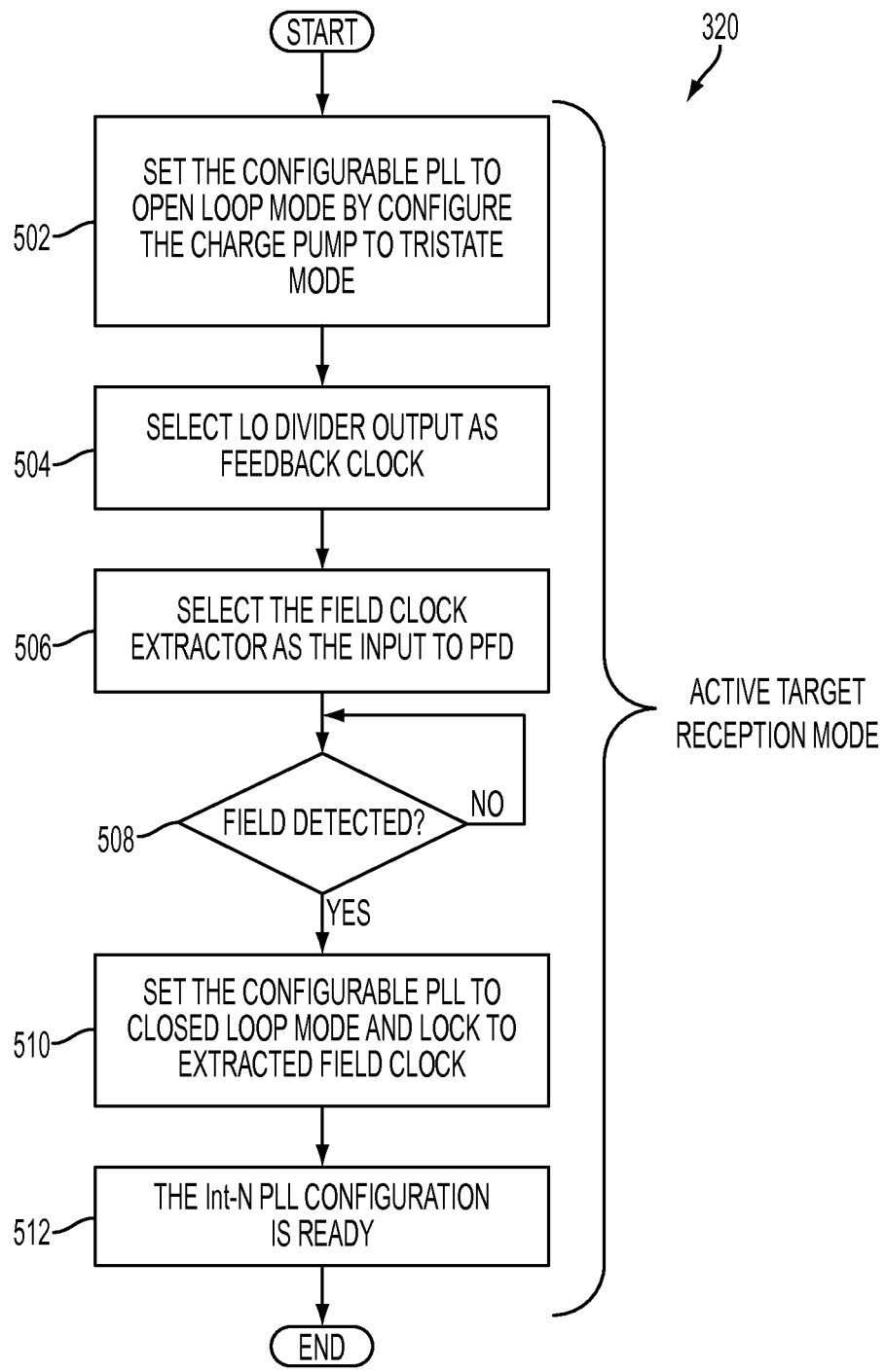
FIG. 5 is a flow chart of active target reception.

FIG. 5 is a flow chart of active target reception. Referring to FIGS. 2A and 5 together, first the reconfigurable PLL 200 is set to open loop mode is set by configuring the CP of circuit 220 to a tristate mode, via step 502. Next, the LO divider 224 output is selected as feedback clock, via step 504. The clock extractor 206 is then selected as the input to the PFD of the circuit 220, via step 506.

Figure 6:
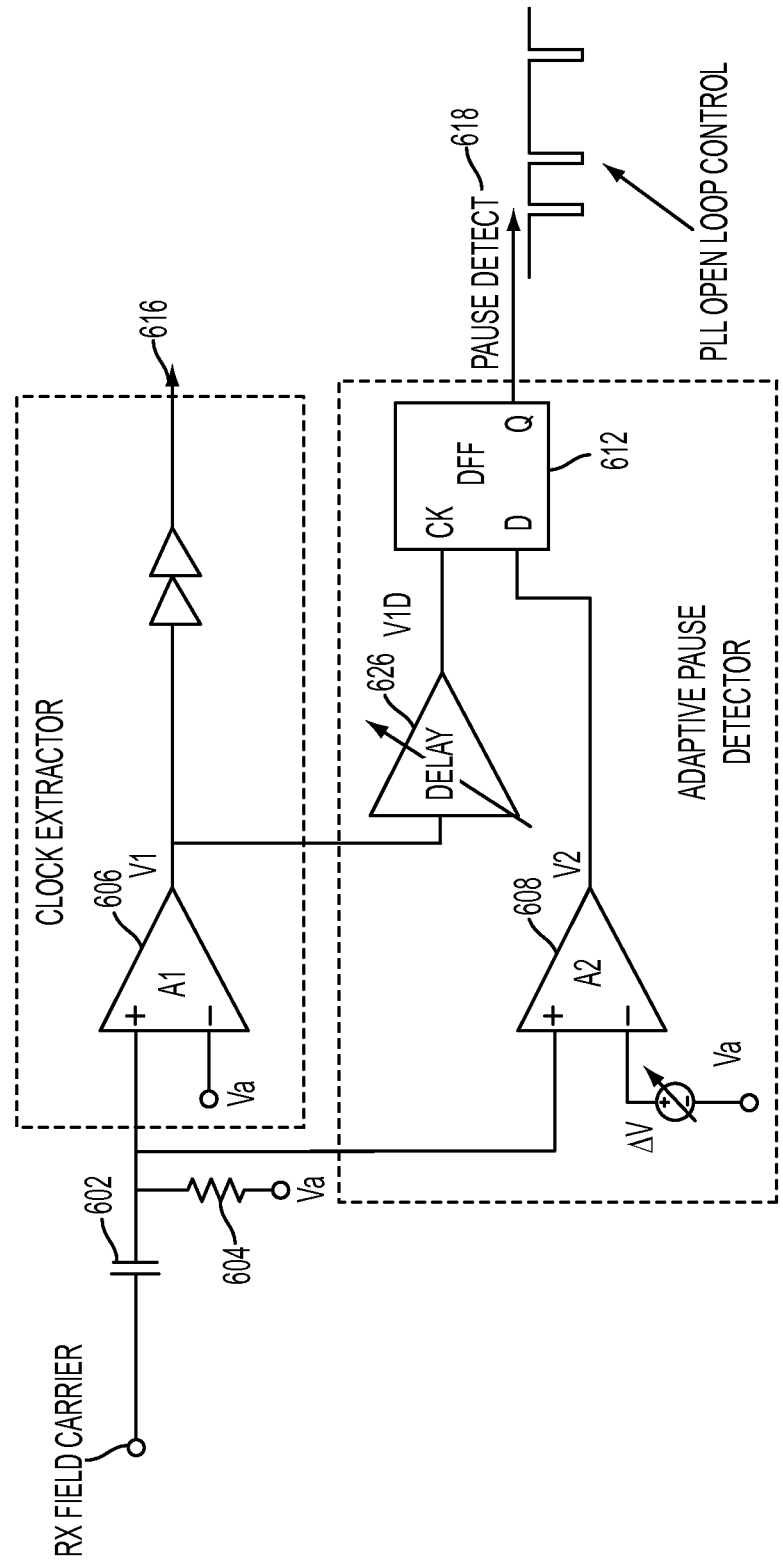
FIG. 6 is a diagram of the level sensitive clock extractor.

FIG. 6 is a diagram of the level sensitive clock extractor. A capacitor 602 is coupled to a resistor 604 and the non-inverting input of a first operational amplifier (op-amp) 606. The resistor 604 is also coupled to the ground (e.g., Va). The inverting input of the op-amp 606 is coupled to the ground (e.g., Va). The capacitor 602 and the resistor 604 are also coupled to the non-inverting input of a second op-amp 608. An output v1 of the op-amp 606 is then coupled to a delay element 626. An output V1D of the delay element 626 is coupled to the clock-input (CK) of the D flip-flop 612. An output v2 of the op-amp 608 is coupled to the D-input of the D flip-flop 612.

The output 616 is a clock to PLL. A output Q of the D flip-flop 612 is also coupled to PLL open loop control 618. The PLL open loop control 618 from clock extractor is used for the fast dynamic switching of the configurable PLL 200 from TX mode to RX mode and vice versa.

Referring back to FIG. 5, after the clock extractor 206 is selected; a determination is then made on whether the field is detected, via step 508. If the field is not detected, via step 508 will be repeated until a field is detected.

When the field is detected, the reconfigurable PLL 200 is set to closed loop mode and is locked to the extracted clock, via step 510. Finally, the Integer-N PLL configuration is ready, via step 512. If the field is not detected, step 508 will be repeated.

P2P Active Initiator Mode with Fast Dynamic Synchronized Switching

Figure 2F:
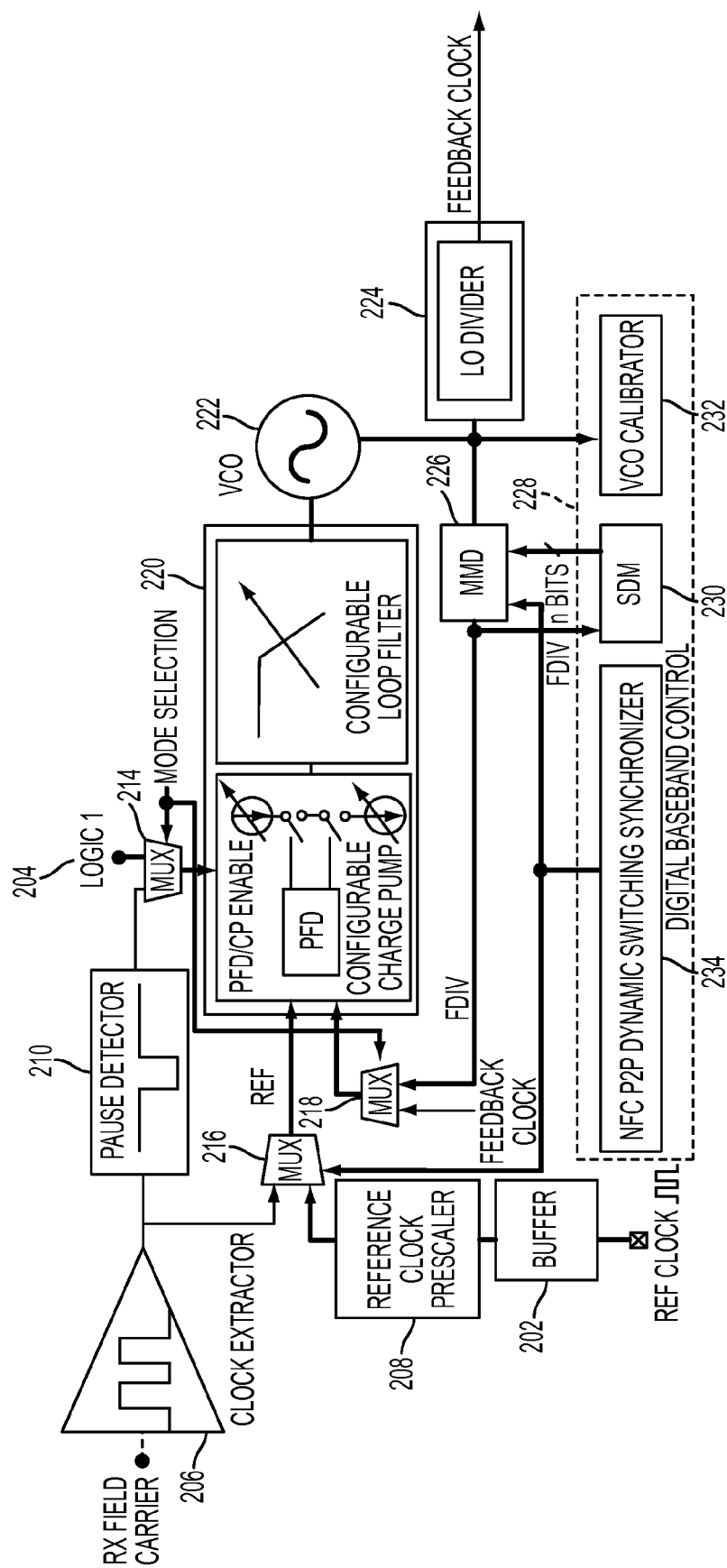
Figure 2G:
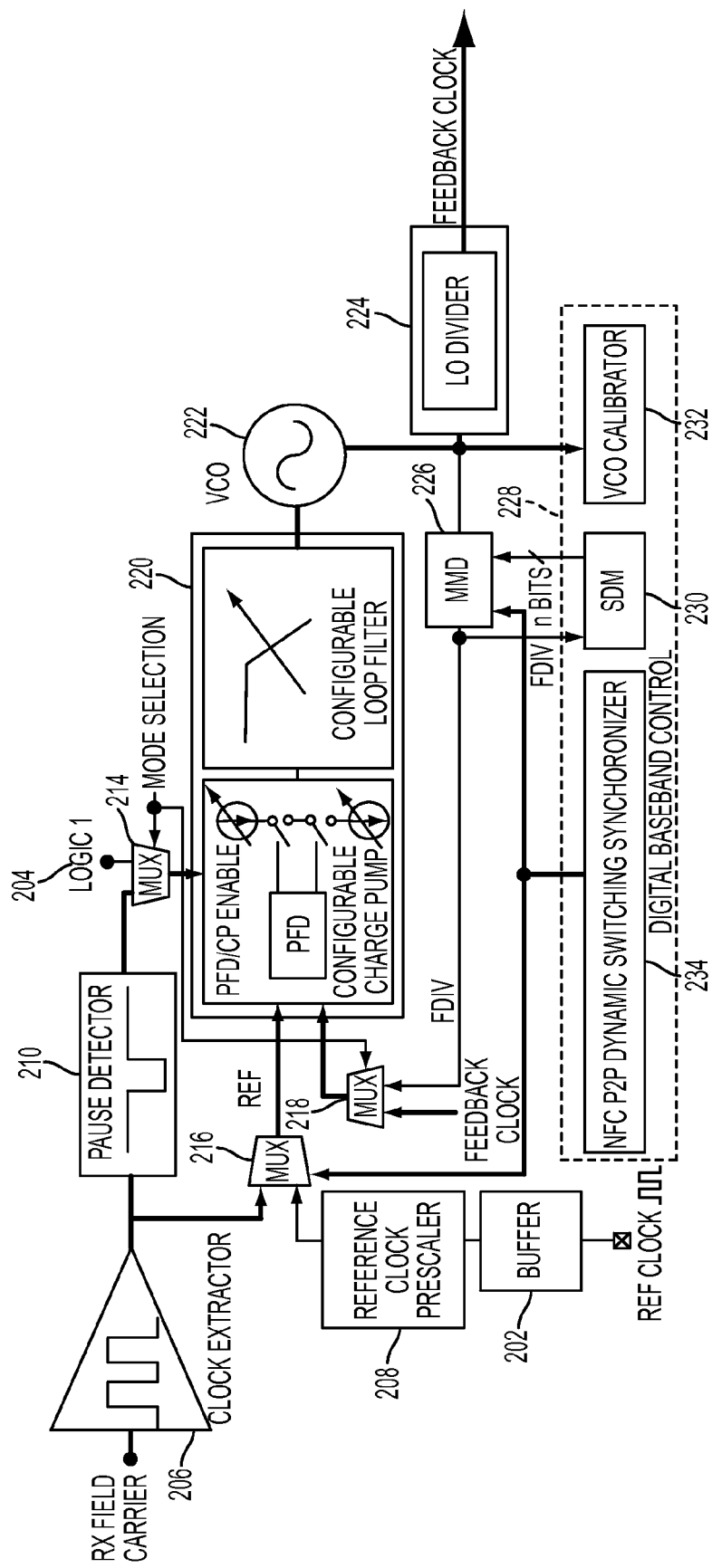

FIGS. 2F and 2G illustrate the reconfigurable PLL 200 operating in NFC P2P active initiator transmission/reception modes, respectively, in which the bolded lines show the enabled signal connections in the corresponding mode. The reconfigurable PLL 200 will be configured to a carrier recovery PLL which is locked to a clock extracted from the carrier in NFC field during data reception. Once data has been demodulated and active target is requested, the target will be configured to fractional-N PLL to generate the NFC field from reference/XO clock. Since VCO sub-band and LO dividers remained unchanged, the same clock to baseband path remain continuous throughout the P2P active initiator communications.

Figure 7:
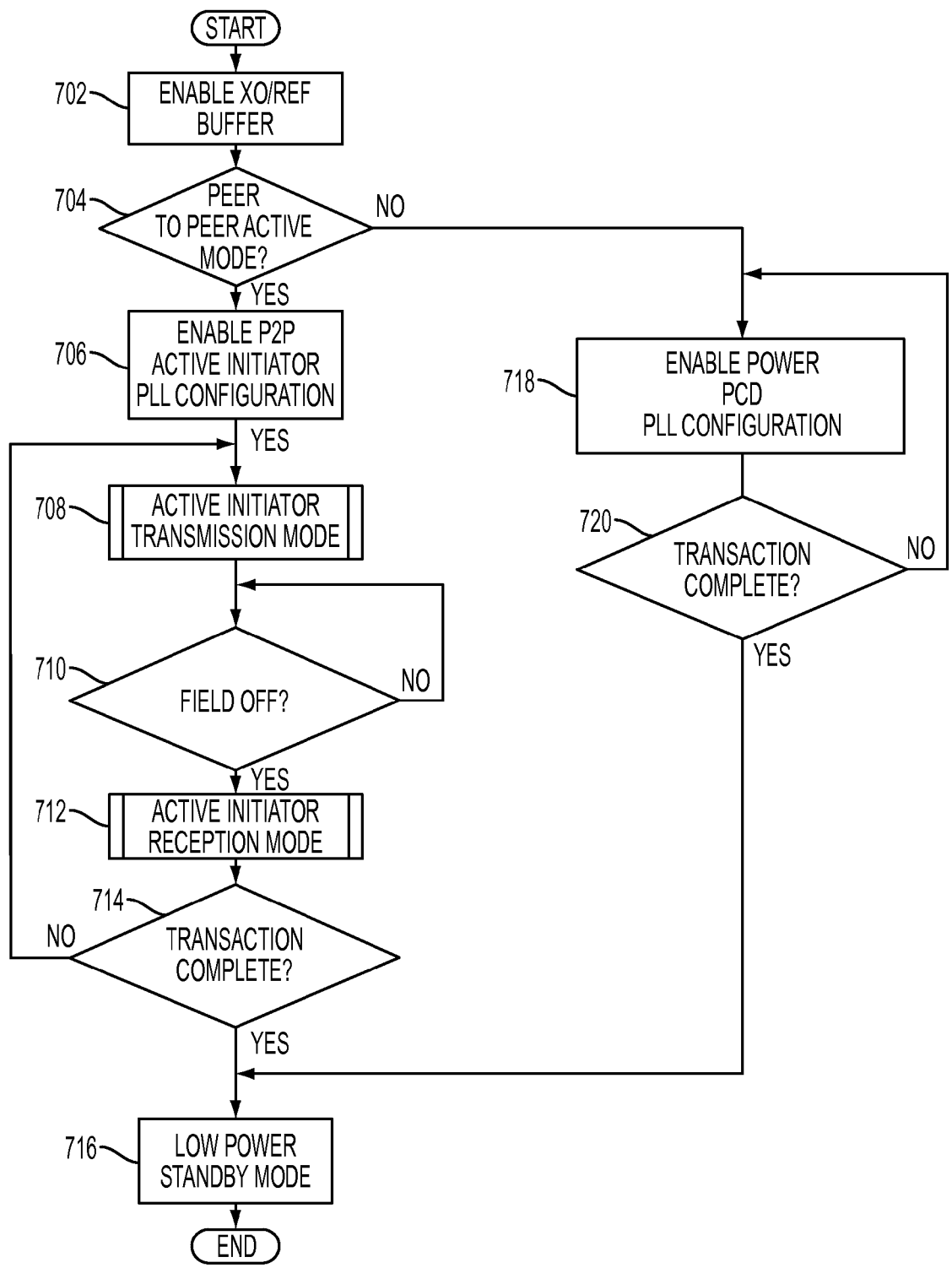
FIG. 7 is a flow chart of an active initiator during P2P communication.

FIG. 7 is a flow chart of an active initiator during P2P communication. Referring to FIGS. 2F and 7 together, first the buffer 202 is enabled, via step 702. Then it is determined if the reconfigurable PLL 200 is in a P2P active mode, via step 704. If the reconfigurable PLL 200 is in the active mode then a P2P active initiator PLL configuration is set, via step 706. Next it is determined if the active initiator transmission mode is set, via step 708. Then it is determined if the field is off, via step 710. If the field is on the reconfigurable PLL 200 remains in active initiator transmission mode. If the field is off then the active initiator reception mode is initiated, via step 712. Then it is determined if the transaction is complete, via step 714. If the transaction is complete then low power standby mode is enabled, via step 716.

If the transaction is not complete, then return to step 708. If the reconfigurable PLL 200 is not in a P2P active mode, via step 704, then a power PCD PLL configuration is enabled, via step 718. Then a determination is made as to whether the transaction is complete, via step 720. If the transaction is no complete then steps 718 and 720 will be repeated until the transaction is complete. Once the transaction is complete the reconfigurable PLL 200 goes into low power standby mode, via step 716.

Figure 8:
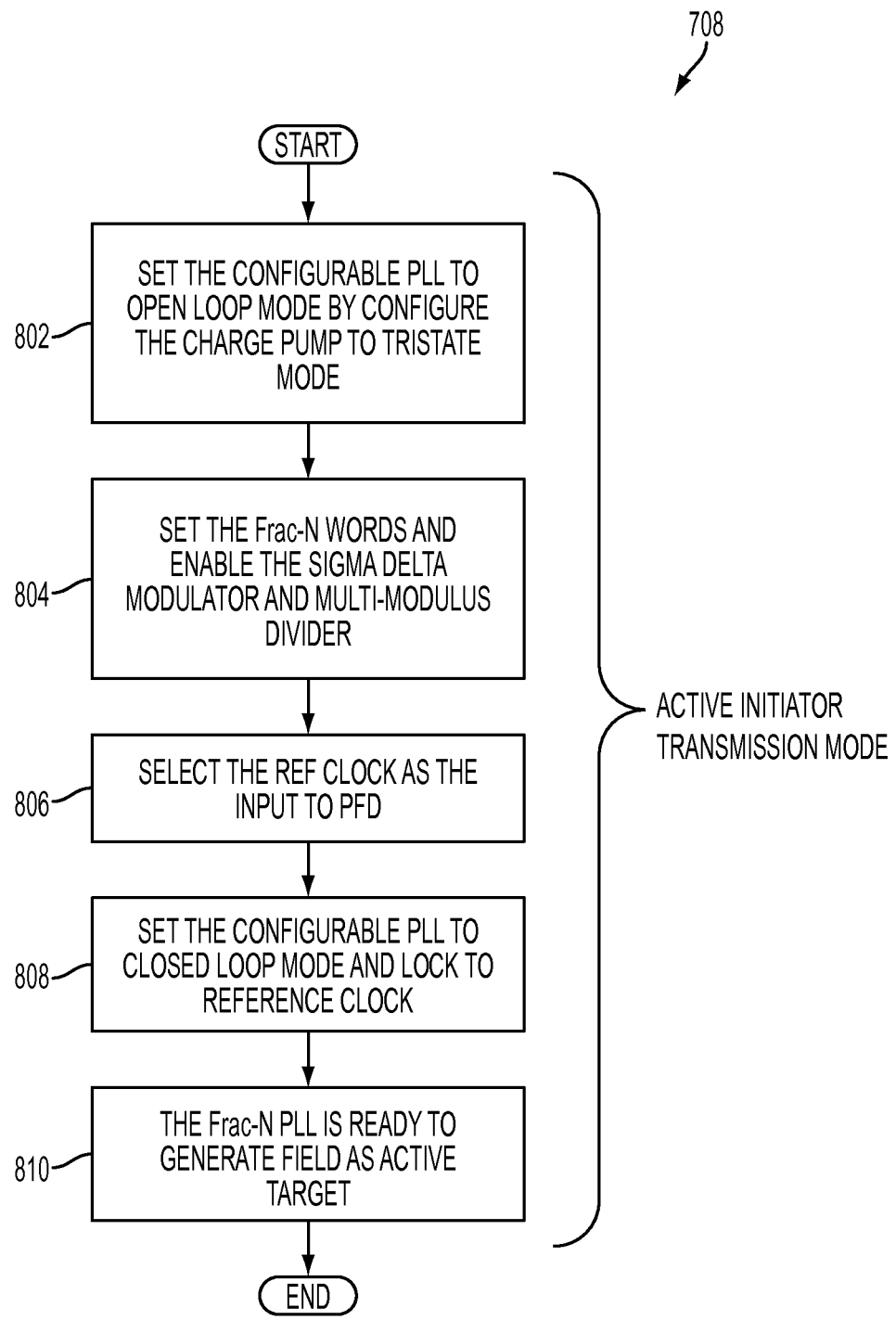
FIG. 8 is a flow chart that illustrates the active initiator transmission mode of FIG. 7.

FIG. 8 is a flow chart that illustrates the active initiator transmission mode (step 708) of FIG. 7. In the initiator transmission mode step 708, first the reconfigurable PLL 200 is set to open loop mode by configuring the CP of circuit 220 to a tristate mode via step 802. Next the fractional-N words are set and the sigma delta modulator (SDM) 230 and multi-modulus divider (MMD) 226 are set, via step 804. Next, the reference clock is selected as the input to the PFD of the circuit 220, via step 806. The reconfigurable PLL 200 is set to closed loop mode and the reference clock is locked, via step 808. The fractional-N PLL is ready to generate a field as an active target, via step 810.

Figure 9:
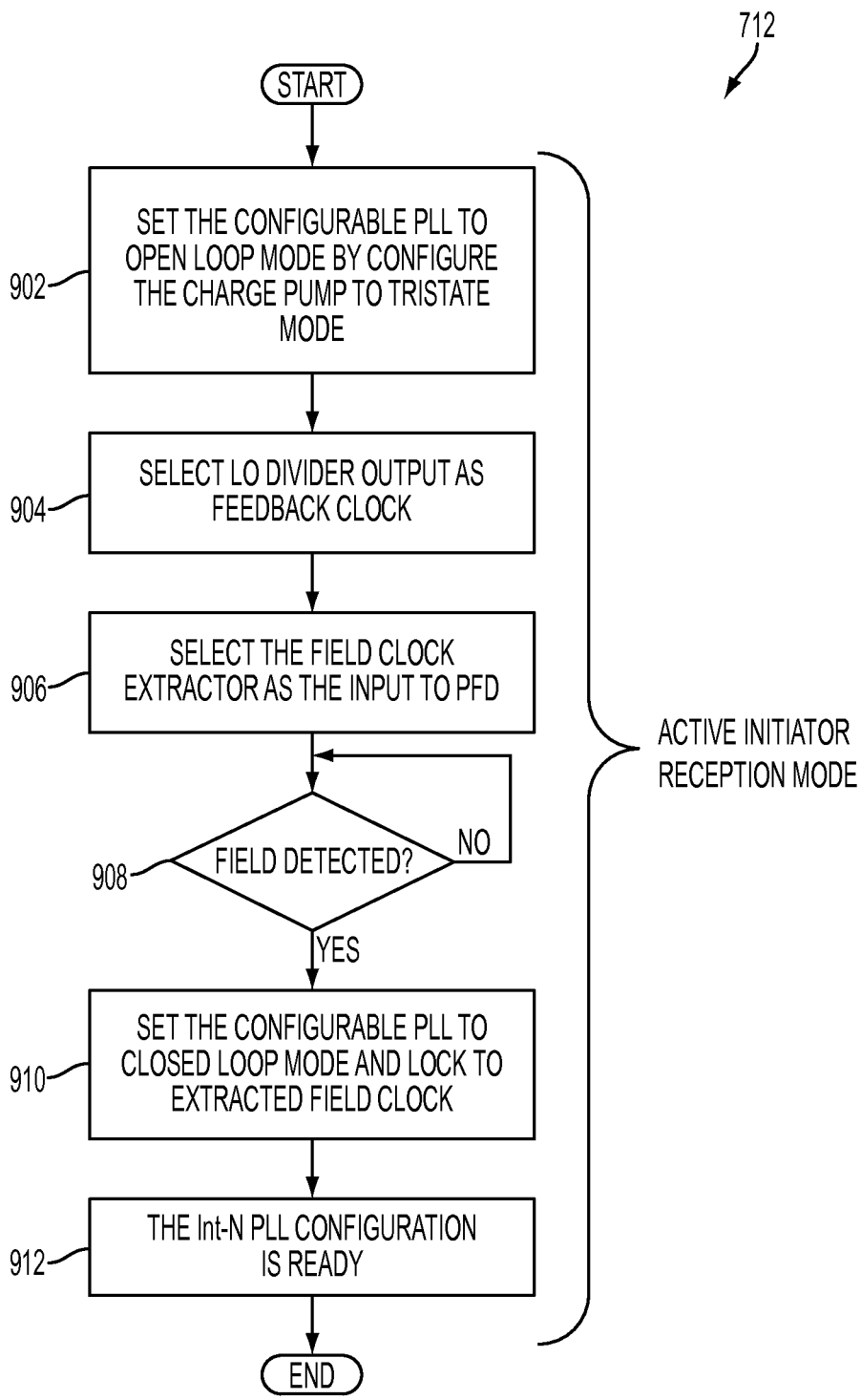
FIG. 9 is a flow chart that illustrates active initiator reception mode of FIG. 7.

FIG. 9 is a flow chart that illustrates active initiator reception mode (step 712) of FIG. 7. First the reconfigurable PLL 200 is set to open loop mode by configuring the CP of the circuit 220 to a tristate mode, via step 902. Next the LO divider 224 output is selected as a feedback clock, via step 904. Thereafter, the clock extractor circuit 206 is selected as the input to PFD of the circuit 220, via step 906. Next it is determined if a field is detected, via step 908. If no is detected then wait for a field to be detected at step 908. If a field is detected the reconfigurable PLL 200 is set to a closed loop mode and is locked to the extracted field clock, via step 910. Thereafter, the integer-N PLL configuration is ready, via step 912.

Figure 10:
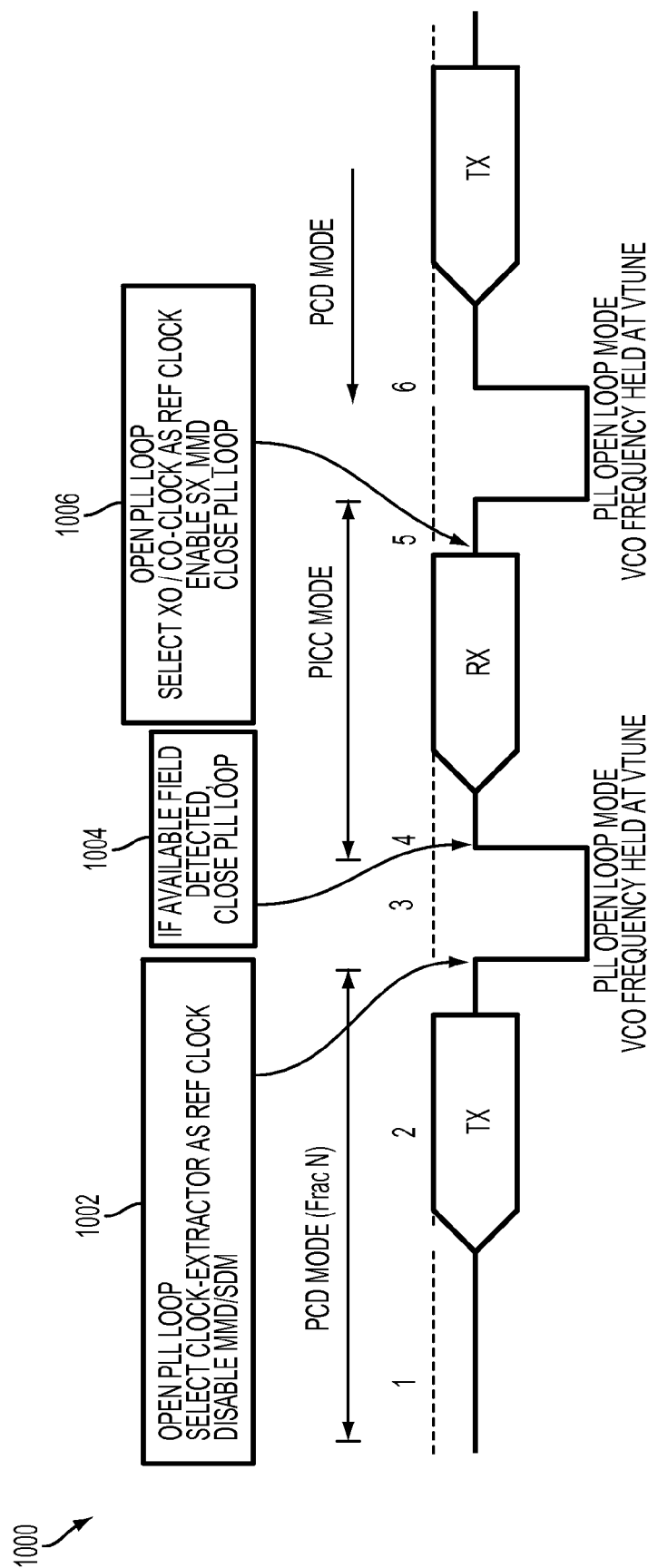
FIG. 10 is a waveform that illustrates the operation of the reconfigurable PLL during P2P communication.

FIG. 10 is a waveform that illustrates the operation of the reconfigurable PLL 200 during P2P communication. The communication flow when in P2P mode is described below.

1. An NFC Field is generated (fractional-N PLL locked to reference clock)
2. Data is sent as P2P initiator (host) and the field is turned off and the transmitter (TX) is disabled after data has been transmitted
3. When field off i.e., no valid clock, PLL loop is opened and hold the Vtune. The PLL is then configured to be ready to lock to receiver (RX) field.
4. Once the RX field is available and a valid clock extracted, the PLL loop is closed to lock to the received NFC field and the data is then demodulated.
5. End of frame (EOF) data is detected and the PLL loop is opened. The fractional-N PLL is configured to lock to reference clock/crystal oscillator clock.
6. The data is sent and host handshaking is performed.

Figure 11:
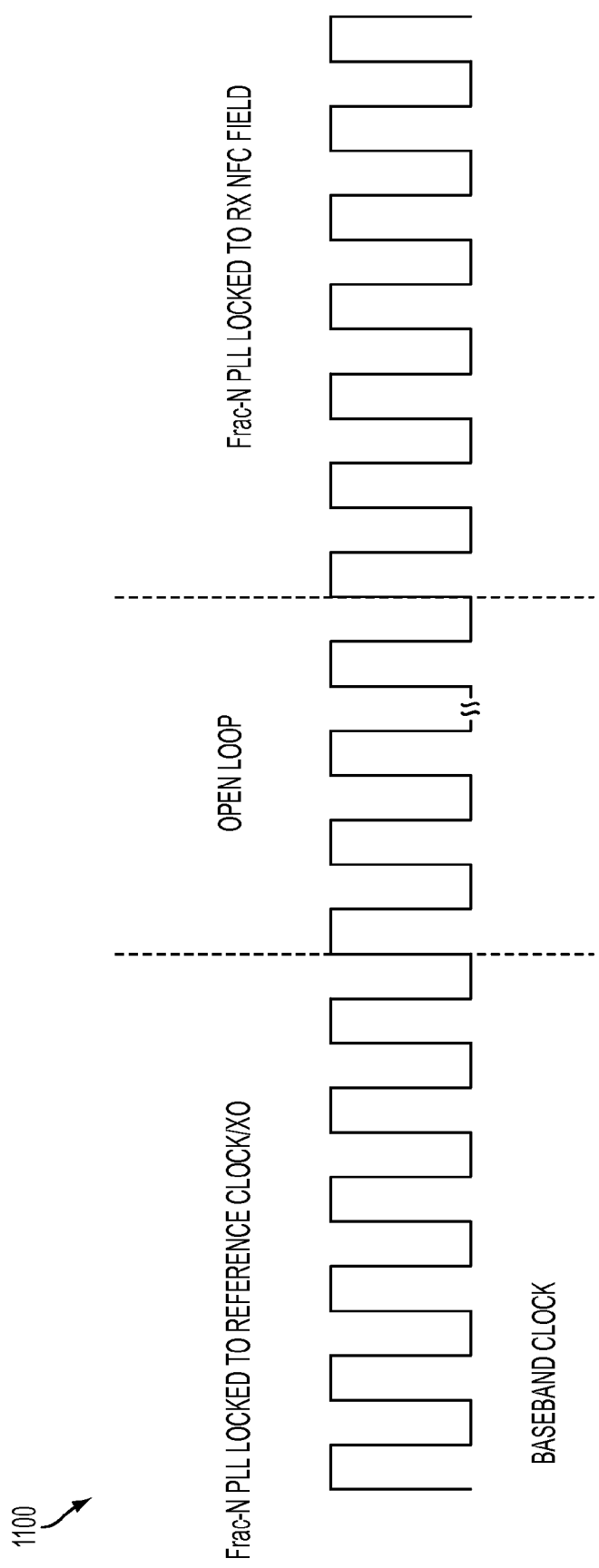
FIG. 11 is a waveform illustrating the continuous baseband clock signal during the TX and RX mode switching provided by the reconfigurable PLL.

FIG. 11 is a waveform illustrating the baseband clock signal provided to the reconfigurable PLL 200. A single continuous clock can be generated to baseband using a fast dynamic synchronized switching method. Baseband do not need to handle complex clock switching and swapping for 2 unrelated clocks in conventional approach.

For fast synchronized switching, the following are the key attributes:

1. VCO sub-band and LO dividers do not change throughout the P2P mode. Therefore, VCO calibration time is saved since VCO recalibration is not required and the the baseband clock is continuous throughout the P2P operation, thus able to support baseband circuit operating in synchronous mode.
2. To ensure that the baseband clock does not deviate to much during the switching mode, the clock extractor circuit will detect the absence of a field (when the initiator turns off the field) i.e., no valid clock and set the charge pump output to tri-state and hold the VTUNE charge (e.g., the tuning voltage applied to the VCO) and the reconfiguration (MMD/SDM/input reference mux switch) is completed and the loop is closed.
3. The clock extractor circuit is used to close the PLL loop only if field and valid 13.56 MHz clock is detected from the other NFC device.

The accurate and fast triggering to open the loop and triggering to close the loop is very critical and depend on the clock extractor automatic field detect ON/OFF.

ADVANTAGES

The advantages of the mentioned invention are:
1. Area and current saving due to synthesizer (SX) circuit re-use (PFD, charge pump, VCO, loop filter).
2. Co-existence Interference avoidance due to non simultaneous operation clock recovery circuit and fractional-N PLL during active P2P Mode.
3. Simple digital demodulation architecture due to clock synchronicity to H-Field and reference clock during P2P reception mode and transmission mode respectively.
4. Single continuous clock to baseband all the time by using VCO output divided clock. No clock swapping/synchronization required during P2P active.
5. Capable of any NFC modes (NFC-A, B, F or P2P passive & P2P active) reception all the time.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A reconfigurable circuit comprising:
   a pause detector mechanism;
   a clock extractor;
   a multiplexer configured to receive a reference clock and coupled to the clock extractor to receive a clock extracted from a carrier of a near field communication (NFC) field; and
   a phase locked loop (PLL) coupled to pause detector mechanism and the multiplexer, wherein the PLL can be configured in a first mode to be locked to the reference clock, in a second mode to be locked to the extracted clock, and in a third mode wherein the PLL can switch between being locked to the reference clock and being locked to the extracted clock.

2. The reconfigurable circuit of claim 1, wherein in the first mode the PLL is configured as a fractional-N PLL.

3. The reconfigurable circuit of claim 1, wherein in the second mode the PLL is configured as a carrier recovery PLL.

4. The reconfigurable circuit of claim 1, wherein in the third mode the PLL is configured as a carrier recovery PLL which is locked to the extracted clock during data reception and is configured as a fractional-N PLL to generate an NFC field from the reference clock once data has been demodulated by the target.

5. The reconfigurable circuit of claim 4, wherein the reference clock to baseband path remains continuous throughout communication.

6. The reconfigurable circuit of claim 1, wherein the PLL comprises:
   a phase frequency detector (PFD);
   a charge pump coupled to the PFD;
   a loop filter coupled to the charge pump; and
   a voltage controlled oscillator (VCO) coupled to the loop filter.

7. The reconfigurable circuit of claim 1, wherein the first mode comprises a reader mode, the second mode comprises a card mode and the third mode comprises a peer to peer mode.

8. The reconfigurable circuit of claim 7 includes a local oscillator (LO) divider coupled to the VCO.

9. The reconfigurable circuit of claim 8 includes a digital baseband control mechanism coupled in feedback relationship between the VCO and the PFD.

10. The reconfigurable circuit of claim 1, wherein the clock extractor is used to close the PLL loop only if an NFC field is present and a valid clock signal is detected from another NFC device.

11. A method for reconfiguring a phase locked loop (PLL) comprising:
    configuring the PLL in a first mode to be locked to the reference clock;
    configuring the PLL in a second mode to be locked to a clock extracted from a carrier of a near field communication (NFC) field; and
    configuring the PLL in a third mode such that the PLL can switch between being locked to the reference clock and being locked to the extracted clock.

12. The method of claim 11, wherein the first mode comprises a reader mode, the second mode comprises a card mode and the third mode comprises a peer to peer mode.

13. The reconfigurable circuit of claim 11, wherein in the first mode the PLL is configured as a fractional-N PLL.

14. The reconfigurable circuit of claim 13 wherein in the second mode the PLL is configured as a carrier recovery PLL.

15. The reconfigurable circuit of claim 14, wherein in the third mode the PLL is configured as a carrier recovery PLL which is locked to the extracted clock during data reception and is configured as a fractional-N PLL to generate an NFC field from the reference clock once data has been demodulated by the target.

16. The reconfigurable circuit of claim 11, wherein the reference clock to baseband path remains continuous throughout communication.

17. The method of claim 11 wherein a PLL loop is closed only if an NFC field is present and a valid clock signal is detected from another NFC device.

* * * * *